United States Patent
Signoff et al.

(10) Patent No.: US 10,707,813 B2
(45) Date of Patent: Jul. 7, 2020

(54) HIGH EFFICIENCY SWITCHING POWER AMPLIFIER

(71) Applicant: Apple Inc., Cupertino, CA (US)

(72) Inventors: David M. Signoff, Santa Clara, CA (US); Morteza Nick, San Francisco, CA (US); Anuranjan Jha, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/212,656

(22) Filed: Dec. 6, 2018

(65) Prior Publication Data

US 2020/0186092 A1   Jun. 11, 2020

(51) Int. Cl.
  *H03F 1/02*   (2006.01)
  *H03F 3/195*   (2006.01)
  *H03F 3/217*   (2006.01)

(52) U.S. Cl.
  CPC ........... *H03F 1/0211* (2013.01); *H03F 3/195* (2013.01); *H03F 3/2171* (2013.01); *H03F 2200/451* (2013.01); *H03F 2200/48* (2013.01)

(58) Field of Classification Search
  USPC ............................... 330/251, 10, 207 A, 311
  See application file for complete search history.

(56) References Cited

U.S. PATENT DOCUMENTS

| | | | |
|---|---|---|---|
| 8,766,719 B2 | 7/2014 | Lai et al. | |
| 8,847,685 B2* | 9/2014 | Naeini | H03F 3/301 330/264 |
| 9,548,739 B2* | 1/2017 | Gupta | H03K 19/018507 |
| 9,641,141 B1 | 5/2017 | Zheng et al. | |
| 10,389,240 B2* | 8/2019 | Phillips | H02M 3/158 |

OTHER PUBLICATIONS

US 9,093,957 B2, 07/2015, Nobbe et al. (withdrawn)
Sang-Min Yoo, et al., "A Class-G Switched-Capacitor RF Power Amplifier," IEEE Journal of Solid-State Circuits, vol. 18, No. 5, May 2013, pp. 1212-1224.

* cited by examiner

*Primary Examiner* — Hieu P Nguyen
(74) *Attorney, Agent, or Firm* — Kowert, Hood, Munyon, Rankin & Goetzel, P.C.

(57) ABSTRACT

A power amplifier and method for operating the same is disclosed. The amplifier includes a number of transistors coupled in series between a power node and a ground node. These transistors include a first transistor having a source terminal coupled to the power node, and a second transistor having its source terminal coupled to a ground node. A subset of transistors is also coupled in series between the first and second transistors. During operation in a first mode, the first and second transistors act as switching transistors, switching according to data received thereby. The subset of transistors, during the first mode, act as cascode transistors. During a second mode of operation, the transistors of the subset act as switching transistors, switching in accordance with the received data.

20 Claims, 9 Drawing Sheets

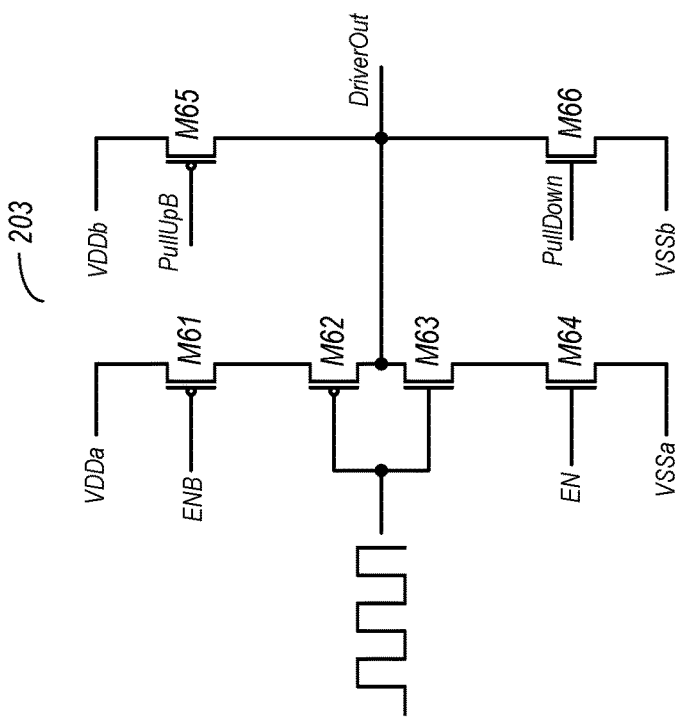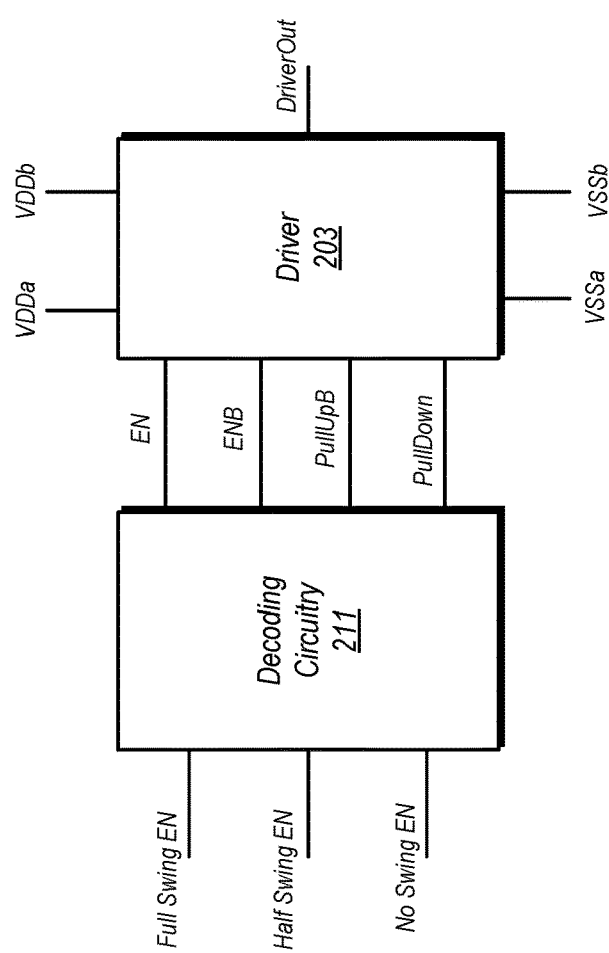
Fig. 6

HIGH EFFICIENCY SWITCHING POWER AMPLIFIER

BACKGROUND

Technical Field

This disclosure is directed to electronic circuits, and more particularly, to power amplifiers used in wireless transmission systems.

Description of the Related Art

Wireless transmitters are ubiquitous in present technology. For example, wireless mobile devices typically include a number of different wireless transmitters for various purposes. For example, a wireless mobile device may include wireless transmitters for cellular data, phone data, Bluetooth connections, and wireless connections. Corresponding wireless receivers may also be included in such devices. Through these various types of wireless transmission/reception technologies, a wireless device may communicate with a wide variety of devices and perform a number of different functions.

Wireless transmitters typically use power amplifiers to provide signal strength for outgoing signals. The signal strength may be adjusted on various factors, such as distance between transmitter and receiver, noise, and so forth. Accordingly, power amplifiers may be implemented to transmit signals over a large range of possible signal strengths. One metric used to indicate the range of signal strengths capable of output by a power amplifier is peak to average ratio. For example, a power amplifier may provide signals at an average output power of ¼ watt, while peak power output by the power amplifier may be greater than ½ watt. To enable it to handle such a wide range, a power amplifier may be designed in such a manner that its input power remains within a specified envelope.

SUMMARY

A power amplifier and method for operating the same is disclosed. In one embodiment, the amplifier includes a number of transistors coupled in series between a power node and a ground node. These transistors include a first transistor having a source terminal coupled to the power node, and a second transistor having its source terminal coupled to a ground node. A subset of transistors is also coupled in series between the first and second transistors. During operation in a first mode, the first and second transistors act as switching transistors, switching according to data received thereby. The subset of transistors, during the first mode, act as cascode transistors. During a second mode of operation, the transistors of the subset act as switching transistors, switching in accordance with the receive data.

In one embodiment, a number of driver circuits are coupled to the series-coupled transistors of the power amplifier. In particular, an output of each of the driver circuits is coupled to a respective gate terminal of a corresponding one of the series-coupled transistors. A given driver may drive the gate terminal of its respectively coupled transistor based on the mode of operation and the data received.

The power amplifier further includes a number of voltage regulators, each of which is coupled to provide a supply voltage to at least one of the driver circuits. Each of the voltage regulators provides a supply voltage that is both unique with respect to that provided by the other voltage regulators, but also less than a supply voltage conveyed on the power node. In addition to providing unique supply voltages, each voltage regulator may provide a return path for a driver circuit that is powered by another supply at a greater supply voltage.

BRIEF DESCRIPTION OF THE DRAWINGS

The following detailed description makes reference to the accompanying drawings, which are now briefly described.

FIG. 6 is a diagram illustrating details of one embodiment of a driver circuit and associated decoding circuitry.

Figure 1:
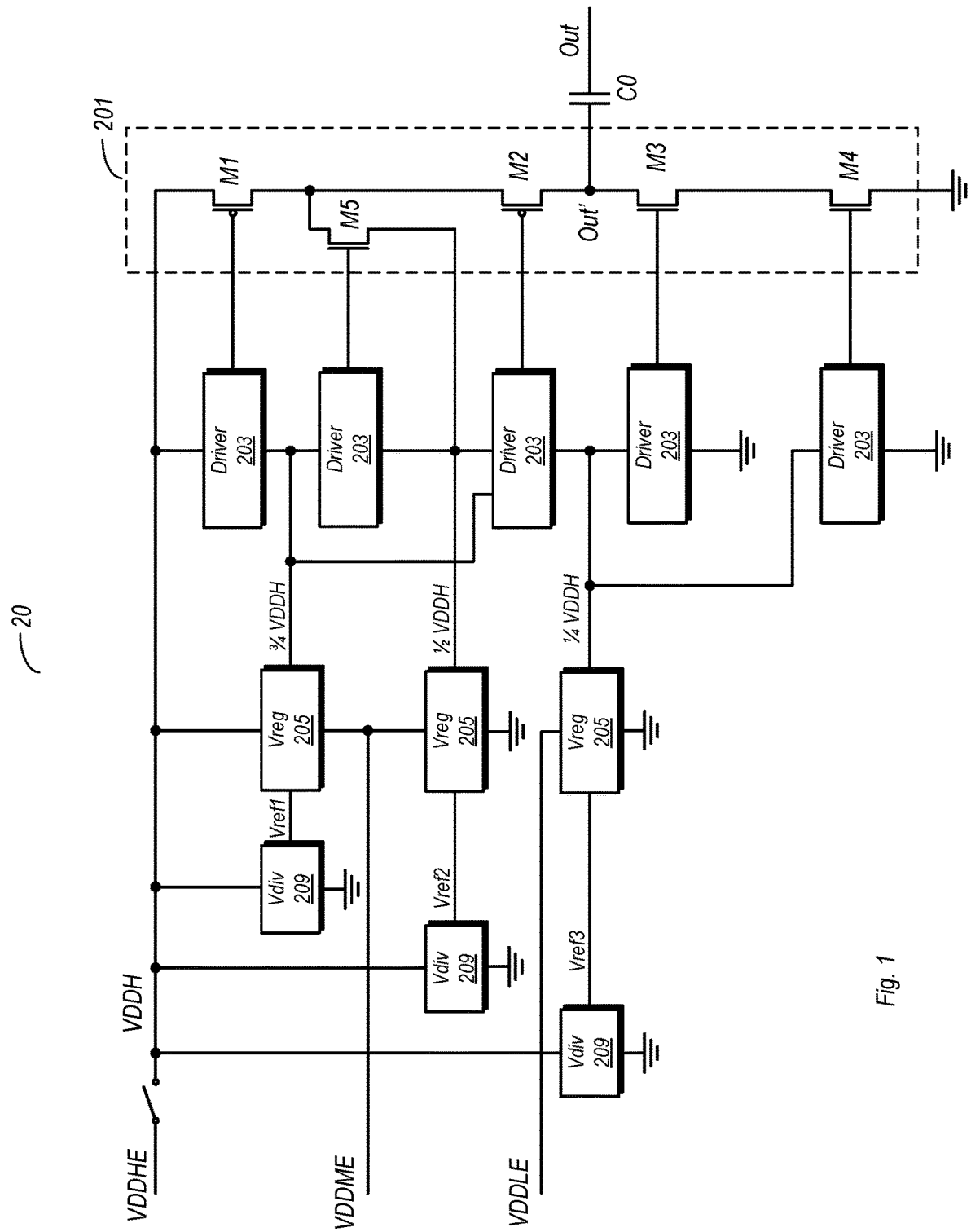
FIG. 1 is a schematic diagram of one embodiment of an amplifier circuit.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry, that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed. FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a power amplifier circuit that may be used in applications including the amplification of signals to be transmitted wirelessly. The amplifier includes a stack of transistors coupled between a power (or supply voltage) node and a ground node. Each of the transistors in the stack includes a respective gate terminal coupled to an output of a corresponding driver circuit. An additional transistor includes a drain terminal coupled to the stack for the purposes of distributing a voltage to the stack, as will be discussed further below.

The amplifier can be operated in a number of different modes, including a full-swing mode, a half-swing mode, and a no-swing mode. During operation in the full-swing mode, a first transistor coupled to the power node and a second transistor coupled to the ground node act as switching transistors (switching states based on received data), while a subset of transistors of the stack (e.g., those not coupled directly coupled to either the power or ground nodes) act as cascode transistors. In this mode of operation, the voltage of the output signal may swing the full range between the voltage level present on the power node and that present on the ground node, or simply the full-swing voltage. However, the gate-source voltage across any transistor within the stack is significantly less than the full-swing voltage due to the arrangement of the circuit.

When operating the amplifier in the half-swing mode, the roles of the transistors in the stack change. In the half-swing mode, the transistors of the subset act as switching transistors (as opposed to cascode transistors when in the full-swing mode). The first transistor remains off during operation in the half-swing mode, while the second transistor remains on. Furthermore, in the half-swing mode, the additional transistor noted above is activated to allow a supply voltage equal to one half the full-swing voltage (present on the power node) to be distributed to the stack. During operation in the half-swing mode, the output signal may vary between one half the full-swing voltage and the ground voltage.

A third mode of operation is the no-swing mode, in which the amplifier outputs no data, but instead provides a steady state voltage, with some of the transistors in the stack being held inactive. In applications in which the amplifier is used in a wireless transmitter, the no-swing mode may be used when no data is available to be sent or transmissions of data are otherwise inhibited.

As noted above, each of the transistors mentioned includes a respective gate terminal coupled to receive a signal from a correspondingly coupled driver circuit. The mode of operation of the amplifier in various embodiments is determined by the output signals provided by the driver circuits. The driver circuits in turn receive control signals from, e.g., decoder circuitry. Based on these control signals, a given driver circuit may either output data (based on received data) or provide a steady state voltage to hold a transistor to a given state.

At least some of the driver circuits are powered by correspondingly coupled voltage regulators, each of which provides a respective output voltage that is less than the voltage present on the power node (and more particularly, the voltage difference between the power and ground nodes). In an example embodiment discussed below, the power node conveys a supply voltage having a value of VDDH, with voltage regulators providing additional supply voltages at ¾ VDDH, ½ VDDH, and ¼ VDDH. Each voltage regulator receives a reference voltage from a voltage divider coupled to VDDH, and thus a droop in VDDH may similarly affect the respective reference voltages applied to each of the voltage regulators. For example, if VDDH falls by 10%, the reference voltage provided to each voltage regulator may also fall by approximately 10%, with the output voltages from each regulator being affected correspondingly. The voltage regulators may each receive a corresponding supply voltage from one of a number of different external power supplies, each having different supply voltage values. In additional to providing respective supply voltages to correspondingly coupled voltage regulators, each external supply voltage may provide a return path for current supplied from another, higher valued external supply voltage.

In some embodiments, a larger amplifier may be implemented using a number of instances of the amplifier circuit disclosed herein. As such, the amplifier circuitry may be considered one cell of a multi-celled amplifier. Furthermore, as any given cell can operate in the various modes discussed in this disclosure, in multi-celled embodiments, the different cells may operate in different modes at the same time. For example, one cell may operate in the full-swing mode while another cell is operating in the half-swing mode.

Turning now to FIG. 1, a schematic diagram of one embodiment of an amplifier circuit is shown. In the embodiment shown, amplifier 20 includes a transistor stack 201 which includes transistors M1, M2, M3, and M4 coupled in series between an external supply voltage VDDH conveyed on a power node, and a ground voltage on a ground node. Transistor stack includes an additional transistor M5 coupled to convey another supply voltage, ½ VDDH, from a voltage regulator 205 to the junction between M1 and M2. Amplifier 20 further includes a number of driver circuits, wherein a respective output of each of the driver circuits is coupled to a corresponding one of the transistors in transistor stack 201. More particularly, each of transistors M1 through M5 includes a respective gate terminal coupled to receive an output signal from a correspondingly coupled driver 203. The inputs to these drivers are not shown in this drawing for the sake of simplicity, although they will be discussed in further detail below. An output path from amplifier 20 is provided from the junction of M2 and M3, through capacitor C0, which provides AC coupling to the output node.

Amplifier 20 includes a number of voltage regulators 205, each of which is coupled to provide an output voltage to a correspondingly coupled one of the driver circuits 203. Each of the voltage regulators provides a respective output voltage provided that is less than a difference between a supply voltage conveyed on the power node and a voltage level on the ground node. Furthermore, each of the voltage regulators is configured to provide a corresponding output voltage that is different from an output voltage provided by the other ones of the voltage regulators. For example, a first one of the voltage regulators 205 may provide a voltage that is ¾ VDDH, a second one may provide a voltage that is ½ VDDH, and a third one may provide a voltage that is ¼ VDDH. Each of the voltage regulators 205 in this embodiment receive respective supply voltages from different external sources. A first voltage regulator 205 receives a supply voltage from VDDHE (the external supply for VDDH), a second voltage regulator 205 receives a supply voltage from VDDME, and a third voltage regulator receives a supply voltage from VDDLE.

Each of the voltage regulators is coupled to receive a corresponding reference voltage, wherein the corresponding reference voltage is based on a supply voltage conveyed on the power node. In the embodiment shown, amplifier 20 includes a number of voltage dividers 209, each of which is coupled to the power node VDDH. A first one of the voltage dividers generates a reference voltage Vref1, a second generates a reference voltage Vref2, while a third generates a reference voltage Vref3. This in turn allows for automatic scaling with variations in VDDH. Since each of these reference voltages is derived from VDDH, a droop in VDDH affects all of the reference voltages in a scaled manner. For example, if VDDH falls by 10%, each of the reference voltages provided to the voltage regulators 205 will also fall by 10%, with the output voltages of each voltage regulator 205 being affected correspondingly. Thus, in percentage terms, a droop to VDDH in the embodiment shown affects all drivers substantially equally in terms of their respectively received supply voltages.

In one embodiment, the voltage regulators 205 are implemented as low dropout (LDO) regulators. It is noted however that embodiments are possible and contemplated in which other types of voltage regulators are used.

Although not shown in this particular drawing, each of the of driver circuits 203 is coupled to receive control signals from associated decoder circuitry. As will be discussed in further detail below, the decoder circuitry associated with a particular one of the of driver circuits may selectively enable that particular one of the driver circuits to convey data to the gate terminal its correspondingly coupled one of the transistors in transistor stack 201. When not enabling its corresponding driver circuit to convey a fixed voltage to the correspondingly coupled one of the plurality of transistors.

It is noted here that the driver circuits 203 and transistors of transistor stack 201 shown in FIG. 1 may comprise a unit cell of which multiple copies may be implemented to form certain embodiments of an amplifier. However, only one instance is shown here for the sake of simplicity.

As discussed above, amplifier 20 in the embodiment shown is capable of different operating modes, including a first mode (in which certain transistors act as switching circuits and a subset of transistors act as cascode devices) and a second mode (in which the subset acts as switching circuits instead of acting as cascode devices). The modes of operation of the embodiment shown in FIG. 1 are now discussed in further detail with reference to FIG. 2.

Figure 2:
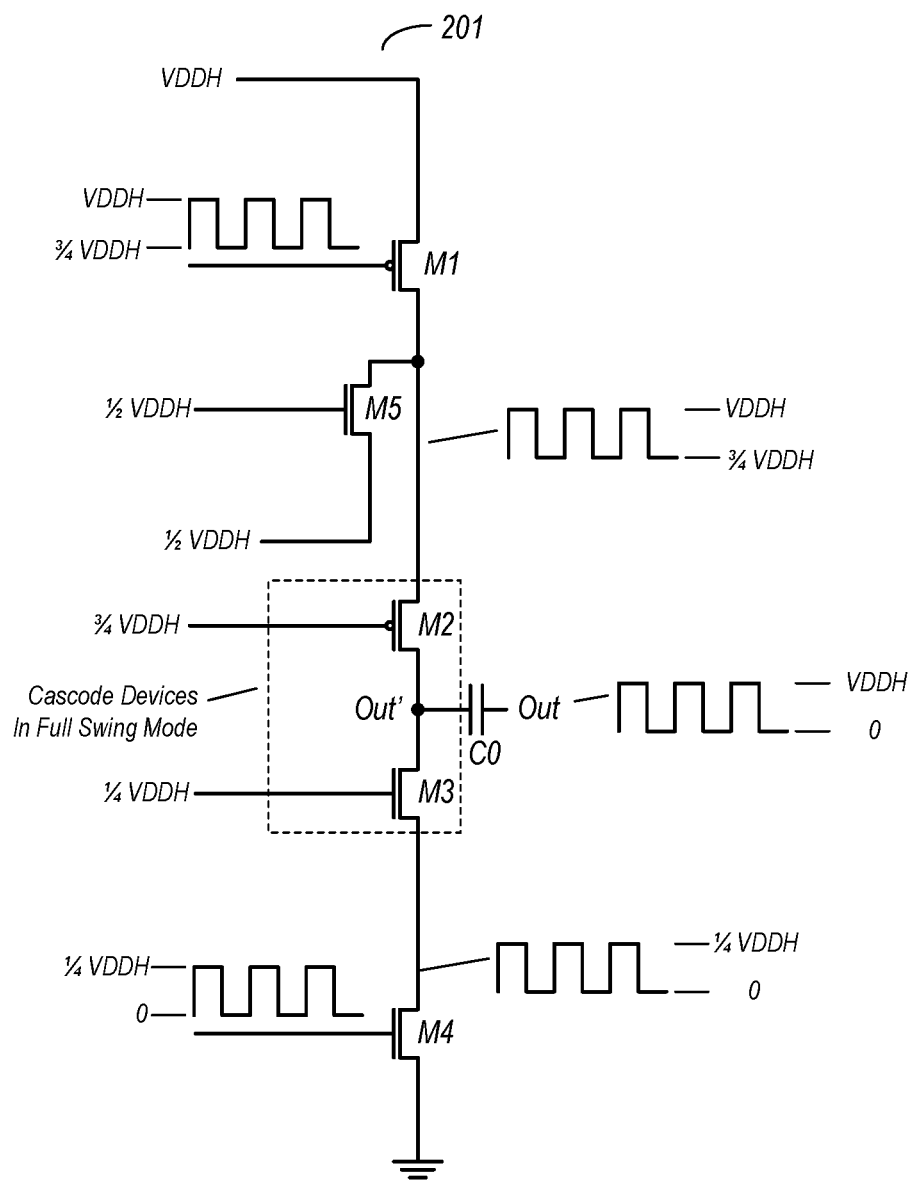
FIG. 2 is a schematic diagram illustrating operation of an amplifier circuit in a first mode.

FIG. 2 is a schematic diagram illustrating operation of an amplifier circuit in a first mode (referred to here as the full-swing mode). In the full-swing mode, an output signal provided by amplifier 20 (and in particularly, from transistor stack 201) may swing substantially the full range of voltage between VDDH and ground.

When operating in the full-swing mode, transistors M1 and M4 act as data switching transistors. That is, each of these devices receive data signals from their respectively coupled driver circuits. The data provided to the gate terminals of M1 and M4 is the same data. As M1 is a PMOS device and M4 is an NMOS device, the collective operation of these two devices is that of an inverter. M1, when active, pulls the output signal up toward VDDH, while M4, when active, pulls the output signal down toward ground.

A subset of the transistors in transistor stack 201, namely M2 and M3 in this particular embodiment, act as cascode devices when operating in the full-swing mode. When in the full-swing mode, the driver circuit 203 coupled to the gate terminal of M2 provides a voltage of ¾ VDDH, with this voltage remaining fixed during this mode of operation. The driver circuit 203 coupled to the gate terminal of M3 in the illustrated embodiment provides a voltage of ¼ VDDH, which also remains fixed during operation in the first mode.

Transistor M5 in the embodiment shown receives from its respective driver circuit 203 a voltage of ½ VDDH on its gate terminal during operation in the full-swing mode. This causes M5 to remain inactive, thereby blocking voltage of ½ VDDH from being conveyed to the junction of M1 and M2.

Although acting as cascode transistors, M2 and M3 may switch on and off dependent on the data provided to the gate terminals of M1 and M4. Transistor M2 in the embodiment shown is activated when M1 is activated, thereby providing a pull-up path between the node Out' and VDDH. Otherwise, when M1 is inactive, M2 may also be inactive due to insufficient source-gate voltage. During operation in the full-swing mode, the voltage on the junction between M1 and M2 varies between VDDH and ¾ VDDH.

Similarly, transistor M3 is activated when M4 is activated during operation in the full-swing mode. When both M3 and M4 are active, a pulldown path exists between Out' and ground. When M4 is inactive, M3 is also inactive due to insufficient gate-source voltage. The voltage on the junction between M3 and M4 varies between ¼ VDDH and zero (ground potential) during operation in the full-swing mode. Since the voltage on Out' is either pulled up toward VDDH, or down toward ground, the voltage swing on Out' is the full-swing between VDDH and zero during operation in the full-swing mode. Capacitor C0 in the embodiment shown provides AC coupling for high frequency signals, and thus the output voltage on the output node of amplifier 20 may vary in the same range as on Out'.

Figure 3:
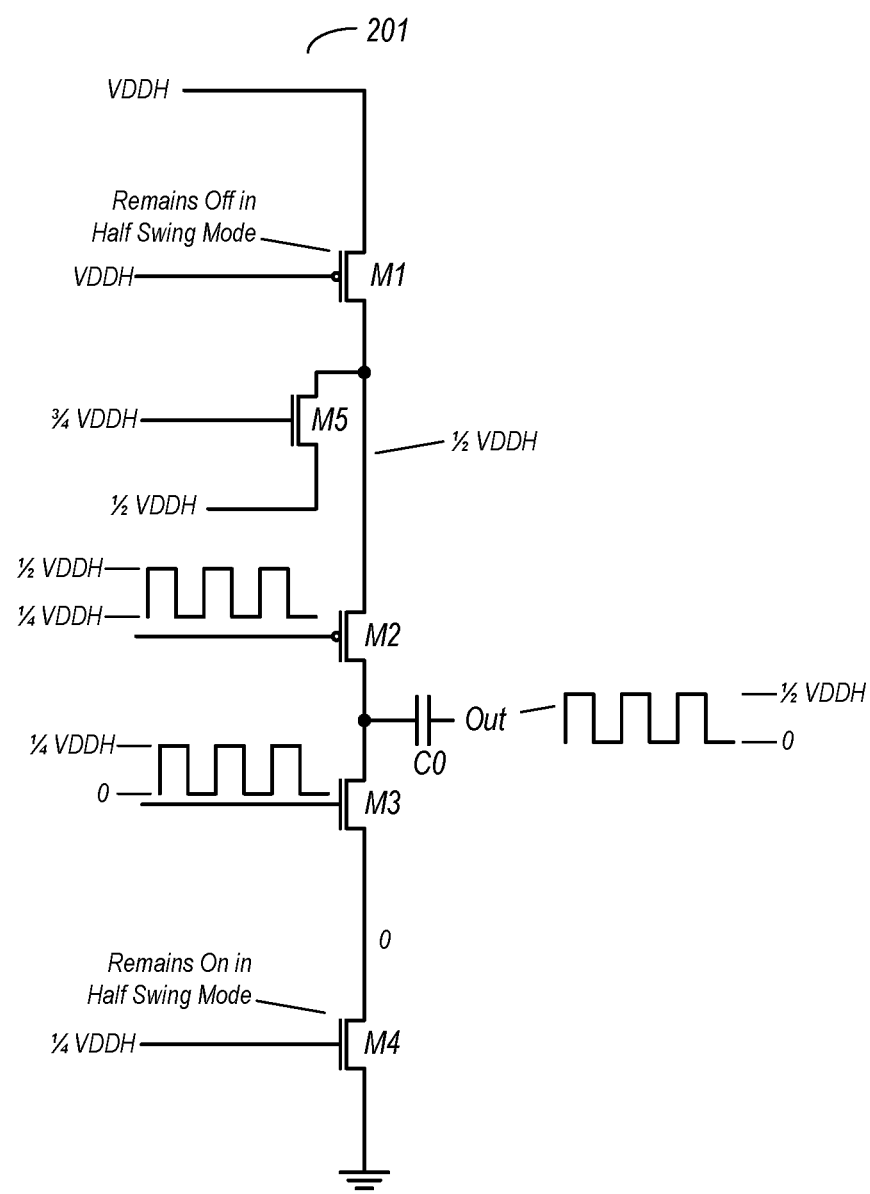
FIG. 3 is a schematic diagram illustrating operation of an amplifier circuit in a second mode.

FIG. 3 is a schematic diagram illustrating operation of an amplifier circuit in a second mode, referred to here as the half-swing mode. When the embodiment shown is operating in the half-swing mode, the roles of the transistors of the subset are reversed relative to their respective roles when operating in the full-swing mode. Transistors M2 and M3 act as switching transistors to convey data received from their respectively coupled drivers when operating in the half-swing mode. Additionally, transistor M1 remains off while transistor M4 remains off in the half-swing mode. Transistor M5 is activated in the half-swing mode to convey a supply voltage of ½ VDDH to the junction of M1 and M2. During operation in this mode, the voltage on Out' swings between ½ VDDH and zero (ground potential).

When operating in the half-swing mode, the gate terminal of M1 receives a voltage of VDDH from its respectively coupled driver circuit 203. The voltage of VDDH remains fixed on the gate terminal of M1 during operation in the half-swing mode. Accordingly, M1 remains inactive. Since M5 is active during operation in the half-swing mode, a voltage of ½ VDDH is present on the junction of M1 and M2. Meanwhile, a voltage of ¼ VDDH is received on the gate terminal of M4, thereby causing this device to be activated and the voltage on the junction of M3 and M4 to be pulled to ground, or zero potential. Transistors M2 and M3 receive data signals at appropriate voltages (but having the same logic values) on their respective terminals, and thus operate a switching devices of an inverter. When M2 is active, Out' is pulled up toward ½ VDDH. When M3 is active, Out' is pulled down toward ground. Accordingly, the voltage swing on Out' is between ½ VDDH and zero.

Figure 4:
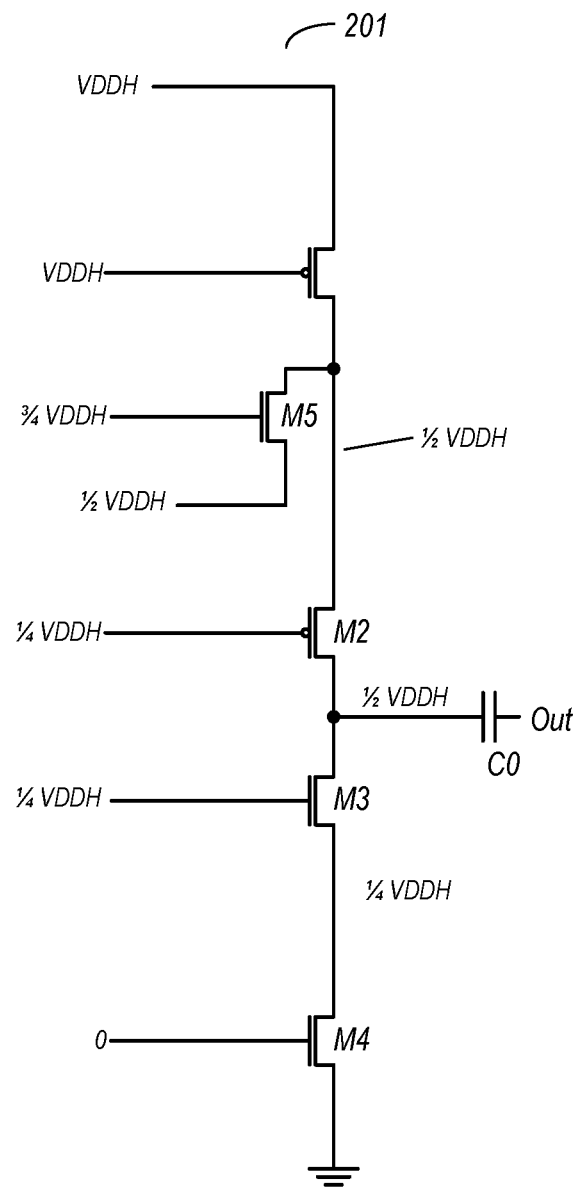
FIG. 4 is a schematic diagram illustrating operation of an amplifier circuit in a third mode.

FIG. 4 is a schematic diagram illustrating operation of an amplifier circuit in a third mode, referred to here as the no-swing mode. This mode of operation may be used during times when, e.g., there is no data to transmit. During operation in the no-swing mode, transistors M1 and M4 are held inactive by virtue of their gate terminals receiving VDDH and zero volts, respectively. Transistors M2 and M3 each receive gate voltages of ¼ VDDH, resulting in the activation of M2 while M3 is inactive. Transistor M5 is activated by receiving ¾ VDDH on its gate terminal, thereby conveying a supply voltage of ½ VDDH to the junction of M1 and M2. Accordingly, Out' is pulled to ½ VDDH. However, since this is a DC voltage, it is blocked from the output node, Out, by capacitor C0.

Figure 5:
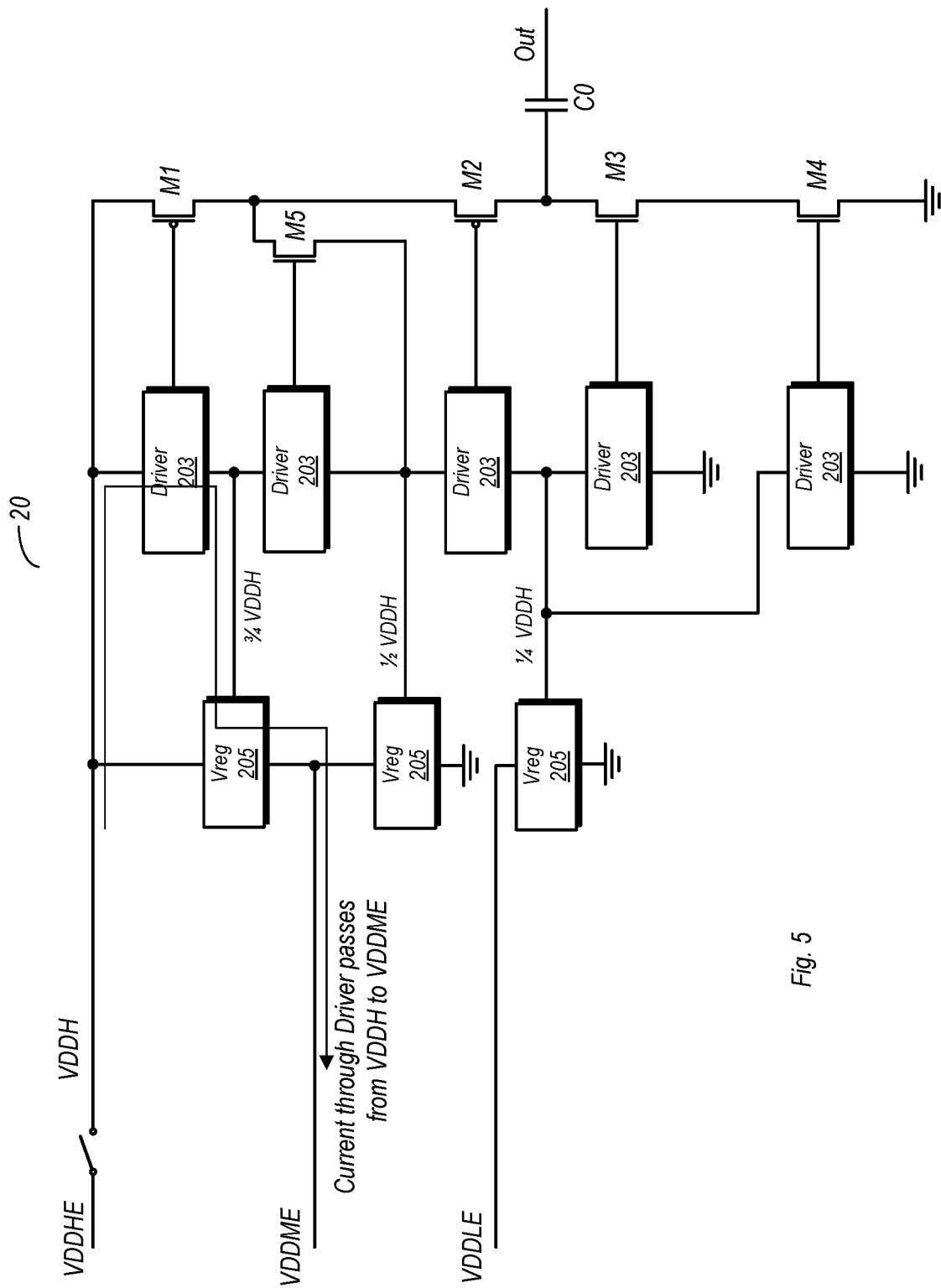
FIG. 5 is block diagram illustrating current distribution in one embodiment of an amplifier circuit.

FIG. 5 is block diagram illustrating current distribution in one embodiment of an amplifier circuit. In particular, FIG. 5 illustrates another power-saving feature implemented in various embodiments of the amplifier circuit disclosed herein. In particular, FIG. 5 illustrates current re-use that is available in various embodiments.

In this example, current from the power node, VDDH, passes through a correspondingly coupled instance of driver 203 from VDDH to ¾ VDDH, which is the output of a first voltage regulator 205. This instance of voltage regulator 205 is references to VDDME rather than ground, and shut current is routed back into the power supply providing VDDME (which may be equivalent to ½ VDDH). This in turn may significantly reduce the power consumed by this driver relative to an alternate arrangement wherein the current was returned to ground. In particular, the power consumed by this driver may be reduced by half relative to an embodiment in which the current return path led to ground. Similar operation occurs through some other drivers 203 in the circuit, e.g., from ¾ VDDH to ½ VDDH, and from ½ VDDH to ¼ VDDH. In these latter two cases, the corresponding voltage regulators 205 may be able to respond to changing current demands since at least some of the current on their respective loads is provided external to the regulator itself. In general, the return path of the top three drivers 203 as shown in FIG. 5 is the next voltage supply down rather than directly to ground. This is a direct result of the stacked power supply/voltage regulator structure shown in the embodiments of FIGS. 1 and 5.

The operation described above, particularly that with respect to the full and half-swing modes, may result in increased efficiency of operation. Because of the arrangement of the various circuit elements (e.g., transistors, voltage regulators, etc.) and the changing of which devices are switching devices and which are cascode devices depending on the operating mode, the amplifier can operate at a full-swing voltage, while individual devices are subject to a gate-source voltage that is only a fraction of this amount. Accordingly, the number of devices loading high swing circuit nodes is minimized.

Thus, the arrangement shown in FIGS. 1-4 and the ability to change the roles of various transistors (e.g., cascode or switching), along with the use of the different voltage regulators to provide different supply voltages may enable various embodiments of the amplifier used herein to more efficiently use the available range of power in, e.g., wireless embodiments with a large peak-to-average power ratio. Furthermore, the arrangement as discussed above may also allow for larger (in terms of voltage) power supplies. The re-use of current as described above with reference to FIG. 5 may allow for additional power savings.

FIG. 6 is a diagram illustrating details of one embodiment of a driver circuit and associated decoding circuitry. More particularly, FIG. 6 illustrates the relation of decoding circuitry 211 to the driver circuits for one embodiment, as well as an embodiment of a driver circuit 203.

Although shown here as a single unit associated with a single driver circuit 203, decoding circuitry 211 may be part of a larger unit of decoders that provide control signals to each of the drivers. In the illustrated embodiment, decoder circuitry 211 is coupled to receive signals indicating a desired mode of operation, Full-swing EN for the full-swing mode, Half Swing EN for the half-swing mode, and No-swing EN for the no-swing mode. These signals may be received from and external source, such as a modulation circuit which will be discussed in reference to FIG. 7.

Based on the received signals, decoding circuitry 211 generates corresponding control signals that are conveyed to driver circuit 203. The control signals conveyed to the driver circuit 203 includes enable signals EN and ENB, PullUpB, and PullDown. For each individual driver circuit, the control signals conveyed thereto are based on its role (and the role of its correspondingly coupled transistors) in the particular mode indicated to decoding circuitry 211. The EN and ENB signals are both asserted for a particular driver circuit 203 when that driver is to be used to convey data during operation in the selected mode. Otherwise, if the particular driver circuit 203 is not to be used to convey data during the selected mode, one of the PullUpB or PullDown signals may be asserted.

Driver circuit 203 in the embodiment shown includes two transistor stacks. The first stack includes transistors M61, M62, M63 and M64. When the enable signals EN and ENB are asserted, transistors M62 and M63 act as an inverter and convey any data received on their respective gate terminals to the DriverOut node. When the enable signals are not asserted, both M61 and M64 are inactive, and thus no data is conveyed due to the lack of pull up and pull down paths.

The second stack of transistors in driver circuit 203 includes transistors M65 and M66. If the particular driver circuit 203 is not to be used to convey data in the selected mode of operation, one of the PullUpB or PullDown signals is asserted. When one of the PullUpB or PullDown signals is asserted, the particular driver circuit outputs a voltage that remains fixed while operating in the selected mode. If the PullUpB signal is asserted, and M65 is activated. This causes the voltage on the DriverOut node to be pulled up toward Vddb. If the PullDown signal is asserted, M66 is activated. When M66 is activated, the voltage on the DriverOut node is pulled down toward VSSb.

In the embodiment shown, driver circuit 203 may be coupled to separate supply and reference voltage nodes. As shown here, the first transistor stack may be coupled to a supply node VDDa and a reference node VSSa, while the second transistor stack may be coupled to a supply node VDDb and a reference node VSSb. Accordingly, a particular driver circuit 203 implemented in various embodiments may receive two different supply voltages (one for each transistor stack) and/or may be coupled to two different reference voltage nodes. However, various driver circuits 203 may also be arranged such that the voltage nodes VDDa and VDDb are coupled to receive the same supply voltage. Similarly, such driver circuits 203 may also be arranged so that the reference nodes VSSa and VSSb are coupled to one another, effectively forming a single node.

Figure 7:
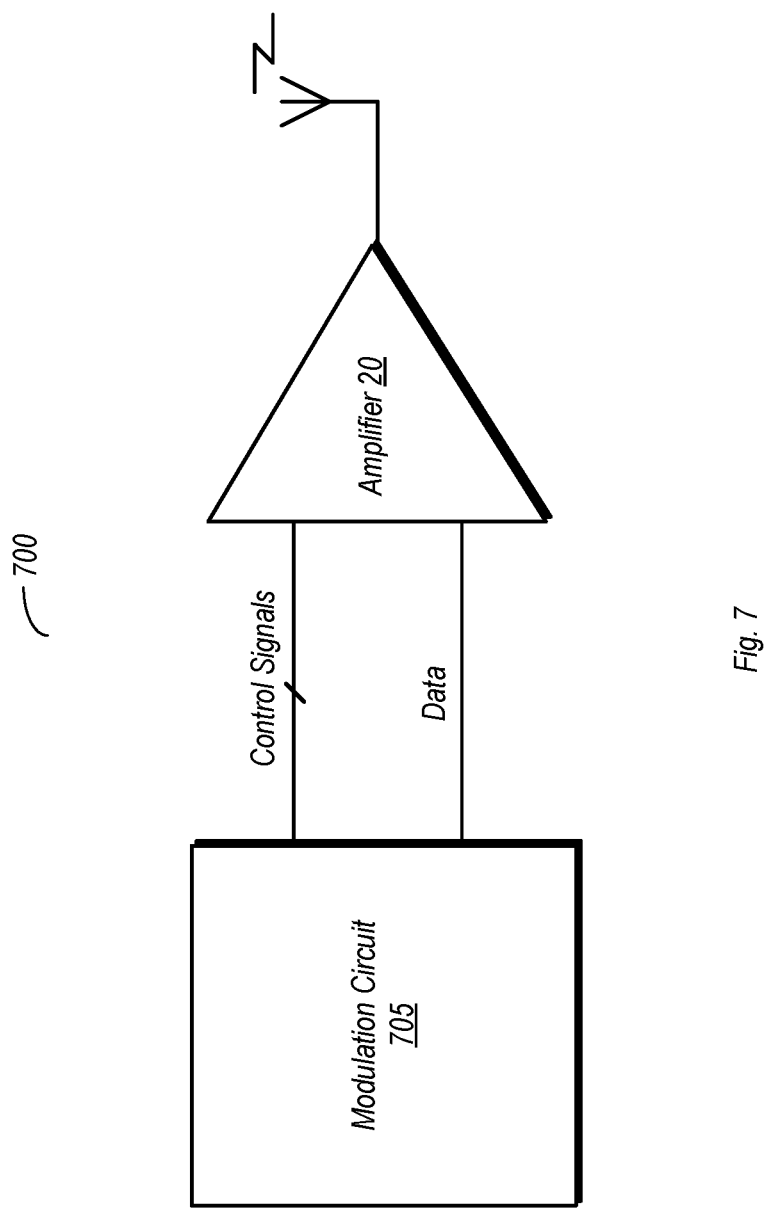
FIG. 7 is a block diagram of one embodiment of a transmitter.

FIG. 7 a block diagram of one embodiment of a transmitter. Transmitter 700 is shown here as an example application of the amplifier discussed above. It is noted however that this is not the only possible application of such an amplifier.

In the embodiment shown, transmitter 700 includes a modulation circuit 705 and amplifier 20, which may be an embodiment of that which discussed in reference to FIGS. 1-6 or variations thereof (including those having multiple instances of the amplifier circuitry). Modulation circuit 705 in the embodiment shown is arranged to provide data and control signals to amplifier 20 on first and second signal paths, respectively. The control signals may be generated within modulation circuit in accordance with a desired mode of operation, which in turn can depend on a desired amount of transmit power. For example for a larger amount of desired transmit power, modulation circuit 705 may provide control signals to amplifier 20 to cause operation in the full-swing mode, while providing control signals to cause operation in the half-swing mode when less transmit power is desired.

Modulation circuit 705 in the embodiment shown also provides data to amplifier 20. The data may be modulated when sent to amplifier 20 by circuitry within modulation circuit 705, and may be provided at a frequency suitable for wireless transmission. The data may be received by modulation circuit 705 from a source external thereto, e.g., other processing circuitry.

Figure 8:
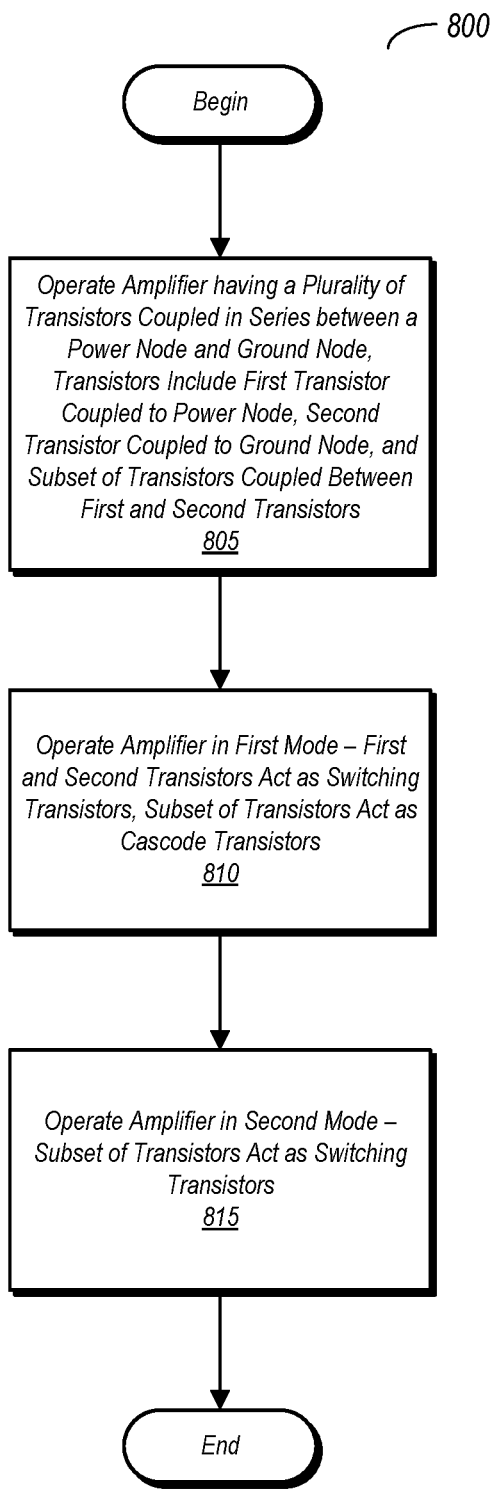
FIG. 8 is a flow diagram of one embodiment of a method for operating an amplifier circuit.

FIG. 8 is a flow diagram of one embodiment of a method for operating an amplifier circuit. Method 800 discussed herein may be performed using hardware embodiments and variations thereof as discussed above with reference to FIGS. 1-7. It is possible and contemplated that hardware embodiments not explicitly discussed herein may also perform method 800. These embodiments may nevertheless fall within the scope of this disclosure.

Method 800 begins with operating an amplifier in a first mode, wherein the amplifier including a plurality of transistors coupled in series between a power node and a ground node, the plurality of transistors including a first transistor having a respective source terminal coupled to the power node, a second transistor having a respective source terminal coupled to the ground node, and a subset of transistors coupled in series between the first and second transistors (block 805). Operating the amplifier in the first mode includes the first and second transistors acting as data switching circuits and the subset of transistors acting as cascode transistors (block 810). The method further comprises operating the amplifier in a second mode, wherein operating in the second mode comprises the subset of transistors act as switching circuits (block 815).

In various embodiments, the method includes a plurality of voltage regulators each providing a voltage to a correspondingly coupled one of a plurality of driver circuits. The voltage provided by each of the voltage regulators is unique with respect to the voltage provided by other ones of the plurality of regulators. An embodiment of the method further includes each of the plurality of driver circuits driving a respective gate terminal of a correspondingly coupled one of the plurality of transistors. With regard to the voltage regulators, the method may include providing a corresponding reference voltage to each, wherein the corresponding reference voltage for each of the voltage regulators is derived from a supply voltage conveyed on the power node. Various embodiments of the method may also include the voltage regulators providing its respective output voltage at a value that is less than a difference between a value of a supply voltage conveyed on the power node and a voltage level present on the ground node.

In some embodiments, the method includes decoding circuitry providing control signals to each of the plurality of drivers. Such embodiments also include enabling, based on the control signals, correspondingly coupled ones of the plurality of driver circuits to convey data to the first and second transistors when operating in the first mode, and, based on the control signals, causing correspondingly coupled ones of the plurality of driver circuits to convey a respective fixed voltage to a respective gate terminal of each of the transistors of the subset of transistors when operating in the first mode. Various embodiments of the method may also include causing, based on the control signals, correspondingly coupled ones of the plurality of driver circuits to convey a respective fixed voltage to a respective gate terminals of the first and second transistors when operating in the second mode, and enabling, based on the control signals, correspondingly coupled ones of the plurality of driver circuits to convey data to respective gate terminals of the transistors of the subset of transistors when operating in the second mode.

Figure 9:
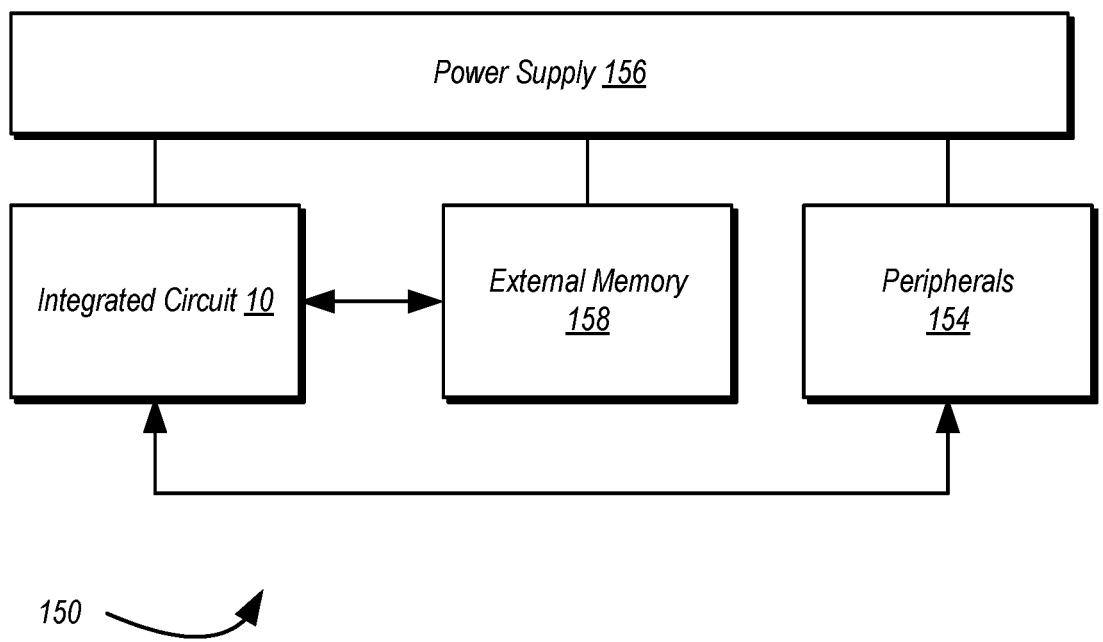
FIG. 9 is a block diagram of one embodiment of an exemplary system.

Turning next to FIG. 9, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

Various embodiments of the IC 10 or peripherals 154 may include circuitry having one or more embodiments of the amplifier discussed above. Such embodiments may also include transmitter circuitry such as that shown in FIG. 7.

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
   a plurality of transistors coupled in series between a power node and a ground node, the plurality of transistors including:
      a first transistor having a respective source terminal coupled to the power node;
      a second transistor having a respective source terminal coupled to the ground node; and
      a subset of transistors coupled in series between the first and second transistors;
   wherein, during a first mode of operation, the first and second transistors act as switching circuits and the subset of transistors act as cascode transistors, and wherein during a second mode of operation, the subset of transistors act as switching circuits.

2. The circuit as recited in claim 1, further comprising a plurality of driver circuits, wherein a respective output of each of the driver circuits is coupled to a corresponding one of the plurality of transistors.

3. The circuit as recited in claim 2, further comprising a plurality of voltage regulators, wherein each of the voltage regulators is coupled to provide an output voltage to a correspondingly coupled one of the plurality of driver circuits.

4. The circuit as recited in claim 3, wherein each of the plurality of voltage regulators is coupled to receive a corresponding reference voltage, wherein the corresponding reference voltage is based on a supply voltage conveyed on the power node.

5. The circuit as recited in claim 3, wherein a respective output voltage provided by each of the voltage regulators is less than a difference between a supply voltage conveyed on the power node and a voltage level on the ground node, and wherein each of the voltage regulators is configured to provide a corresponding output voltage that is different from an output voltage provided by the other ones of the voltage regulators.

6. The circuit as recited in claim 2, wherein each of the plurality of driver circuits is coupled to receive control signals from associated decoder circuitry, wherein the decoder circuitry associated with a particular one of the plurality of driver circuits is configured to selectively enable that particular one of the driver circuits to convey data to a gate terminal of a correspondingly coupled one of the plurality of transistors.

7. The circuit as recited in claim 2, further comprising decoder circuitry configured to provide control signals to associated ones of the plurality of driver circuits, wherein, depending on whether operation is conducted in the first mode or the second mode, a given one of the plurality driver circuits is configured to convey data to a gate of a correspondingly coupled one of the plurality of transistors or convey a fixed voltage to the correspondingly coupled one of the plurality of transistors.

8. The circuit as recited in claim 1, wherein, during the first mode of operation, a voltage of an output signal provided by the circuit varies between a supply voltage conveyed on the power node and a voltage level on the ground node, and wherein, during the second mode of operation, the voltage of the output varies between one half the supply voltage and the voltage level on the ground node.

9. The circuit as recited in claim 1, wherein a respective gate-source voltage across each of the plurality of transistors is less a difference between supply voltage conveyed on the power node and a voltage level on the ground node.

10. A method comprising:
    operating an amplifier in a first mode, wherein the amplifier includes:
       a plurality of transistors coupled in series between a power node and a ground node, the plurality of transistors including a first transistor having a respective source terminal coupled to the power node, a second transistor having a respective source terminal coupled to the ground node, and a subset of transistors coupled in series between the first and second transistors;
    wherein operating the amplifier in the first mode comprises the first and second transistors acting as data switching circuits and the subset of transistors acting as cascode transistors; and operating the amplifier in a second mode, wherein operating in the second mode comprises the subset of transistors acting as switching circuits.

11. The method as recited in claim 10, further comprising:
a plurality of voltage regulators each providing a voltage to a correspondingly coupled one of a plurality of driver circuits, wherein the voltage provided by each of the voltage regulators is unique with respect to the voltage provided by other ones of the plurality of regulators;
each of the plurality of driver circuits driving a respective gate terminal of a correspondingly coupled one of the plurality of transistors.

12. The method as recited in claim 11, further comprising providing a corresponding reference voltage to each of the plurality of voltage regulators, wherein the corresponding reference voltage for each of the voltage regulators is derived from a supply voltage conveyed on the power node.

13. The method as recited in claim 11, further comprising each of the voltage regulators providing its respective output voltage at a value that is less than a difference between a value of a supply voltage conveyed on the power node and a voltage level present on the ground node.

14. The method as recited in 11, further comprising:
decoding circuitry providing control signals to each of the plurality of driver circuits;
enabling, based on the control signals, correspondingly coupled ones of the plurality of driver circuits to convey data to the first and second transistors when operating in the first mode; and
causing, based on the control signals, correspondingly coupled ones of the plurality of driver circuits to convey a respective fixed voltage to a respective gate terminal of each of the transistors of the subset of transistors when operating in the first mode.

15. The method as recited in claim 14, further comprising:
causing, based on the control signals, correspondingly coupled ones of the plurality of driver circuits to convey a respective fixed voltage to a respective gate terminals of the first and second transistors when operating in the second mode; and
enabling, based on the control signals, correspondingly coupled ones of the plurality of driver circuits to convey data to respective gate terminals of the transistors of the subset of transistors when operating in the second mode.

16. A system comprising:
a modulation circuit configured to provide digital data on a first signal path, and a first set of control signals on a second signal path; and
a power amplifier coupled to receive the digital data via the first signal path and the control signal via the second signal path, wherein the power amplifier includes:
a plurality of transistors coupled in series between a power node and a ground node, the plurality of transistors including:
a first transistor having a respective source terminal coupled to the power node;
a second transistor having a respective source terminal coupled to the ground node; and
a subset of transistors coupled in series between the first and second transistors;
wherein the modulation circuit is configured to provide control signals to cause the power amplifier to operate in a first mode, wherein during operation in the first mode, the first and second transistors act as data switching circuits and the subset of transistors act as cascode transistors; and
wherein the modulation circuit is further configured to provide control signals to cause the power amplifier to operate in a second mode, wherein during operation in the second mode the subset of transistors act as data switching circuits, the first transistor is held inactive, and the second transistor is held active.

17. The system as recited in claim 16, wherein the power amplifier further includes a plurality of driver circuit each coupled to receive selected ones of the control signals and further coupled to receive digital data, wherein each of the plurality of driver circuits is coupled to drive a respective gate terminal of a correspondingly coupled one of the plurality of transistors dependent on states of respectively received control signals.

18. The system as recited in claim 17, further comprising:
a plurality of voltage regulators, each of the voltage regulators being coupled to provide an output voltage to a correspondingly coupled one of the plurality of driver circuits;
wherein the output voltage provided by each of the plurality of voltage regulator is less than a voltage conveyed on the power node and is unique with respect to the output voltage provided by the other ones of the plurality of voltage regulators; and
wherein each of the plurality of voltage regulators is coupled to receive a corresponding reference voltage, wherein the corresponding reference voltage is based on a supply voltage conveyed on the power node.

19. The system as recited in claim 16, wherein, during operation in the first mode, a voltage of an output signal provided by the power amplifier varies between a supply voltage conveyed on the power node and a voltage level on the ground node, and wherein, during the second mode of operation, the voltage of the output varies between one half the supply voltage and the voltage level on the ground node.

20. The system as recited in claim 16, wherein the power amplifier further comprises decoder circuitry coupled to receive the first control signals and configured to generated a second set of control signals based on the first set, wherein the decoder circuitry is configured to provide selected ones of the control signals of the second set to corresponding ones of a plurality of driver circuits to cause operation in one of the first or second modes.

* * * * *